United States Patent
Rivet

[19]

[11] Patent Number: 5,995,395
[45] Date of Patent: Nov. 30, 1999

[54] CONTROL OF A COMPOSITE BRIDGE AT ZERO VOLTAGE

[75] Inventor: Bertrand Rivet, Tours, France

[73] Assignee: SGS-Thomson Microelectronics S.A., Saint Genis, France

[21] Appl. No.: 08/835,048

[22] Filed: Mar. 27, 1997

[30] Foreign Application Priority Data

Mar. 29, 1996 [FR] France .................................. 96 04272

[51] Int. Cl.$^6$ ................................................. H02M 7/162
[52] U.S. Cl. ............................................. 363/88; 363/128
[58] Field of Search ................................ 363/84, 85, 86, 363/88, 89, 125, 128

[56] References Cited

U.S. PATENT DOCUMENTS

| | | | |
|---|---|---|---|
| 3,305,763 | 2/1967 | Kupferberg et al. | 363/88 |
| 3,320,512 | 5/1967 | Kruger | 363/88 |
| 3,562,621 | 2/1971 | Schaefer | 320/1 |
| 3,670,226 | 6/1972 | Mazza | 318/345 |
| 3,758,840 | 9/1973 | Oliver | 363/86 |
| 3,908,159 | 9/1975 | Griffey | 363/85 |
| 4,161,022 | 7/1979 | Kanazawa et al. | 363/88 |
| 4,204,148 | 5/1980 | Gaertner | 363/88 |
| 4,675,798 | 6/1987 | Jost et al. | 363/86 |
| 5,202,819 | 4/1993 | Min | 361/436 |
| 5,430,364 | 7/1995 | Gibson | 363/89 |
| 5,568,041 | 10/1996 | Hesterman | 363/89 |
| 5,572,416 | 11/1996 | Jacobs et al. | 363/89 |
| 5,612,609 | 3/1997 | Choi | 363/89 |
| 5,614,812 | 3/1997 | Wagoner | 363/89 |
| 5,804,951 | 9/1998 | Rivet | 363/125 |
| 5,822,203 | 10/1998 | Peron | 363/125 |

FOREIGN PATENT DOCUMENTS

| | | | |
|---|---|---|---|
| 9514380 | 6/1997 | France | H02M 7/04 |
| 9514381 | 6/1997 | France | H03K 17/08 |
| A-34 04 446 | 8/1985 | Germany | H02M 7/162 |

*Primary Examiner*—Jeffrey Sterrett
*Attorney, Agent, or Firm*—Wolf, Greenfield & Sacks, P.C.

[57] ABSTRACT

The present invention relates to a device for controlling a composite bridge including two anode-gate thyristors, the cathodes of which are connected together to a positive output terminal, the gates of the two thyristors being interconnected. The device includes a single-throw switch, controllable to be turned off and on, connected on the one hand to the two thyristors and on the other hand to a reference potential, and control means to turn on the switch only in a predetermined voltage range around the zero voltage of an a.c. voltage of the composite bridge.

37 Claims, 5 Drawing Sheets

CONTROL OF A COMPOSITE BRIDGE AT ZERO VOLTAGE

BACKGROUND OF THE INVENTION

1. Field of the Invention

The present invention relates to the control of a composite bridge for rectifying an a.c. power supply, for example, the mains a.c. voltage, in the vicinity of its transition through zero.

2. Discussion of the Related Art

An example application of such a composite bridge relates to the field of power converters which are meant to supply rectified d.c. power supplies, obtained from an a.c. voltage, and meant to be used as a basis, for example, for a switch-mode power supply system. The bridge is then often associated with a circuit for limiting the current surge of a storage capacitor upon power-on of a rectifier.

Another example application relates to circuits for supplying a resistive load, for example an electric radiator, which is to be supplied by a rectified a.c. voltage. The electric standard generally imposed for the power-on of such a load is in the vicinity of zero voltage of the a.c. power supply.

The conventional circuits for controlling a composite bridge have generally to be fed by a d.c. voltage with a low level with respect to the a.c. voltage. Thus, specific means are usually necessary for providing a supply voltage to the control circuit, with an insulation transformer associated to the supply means. These circuits are therefore complex and expensive.

SUMMARY OF THE INVENTION

According to a first aspect of the invention, a simple and inexpensive device is provided for controlling a composite bridge in the vicinity of zero voltage. The present invention is also aimed at providing such a control device with low power dissipation.

According to a second aspect of the invention, a circuit is provided for limiting the current surge in a storage capacitor of a power converter, using the device for controlling a composite bridge.

GB-A-2256757 discloses a circuit for limiting the current surge in a storage capacitor of a power converter wherein a composite bridge is controlled in the vicinity of zero voltage by means of an operational amplifier. This circuit uses a transformer and an auxiliary bridge to control the amplifier. Additionally, an additional storage capacitor is necessary for supplying the operational amplifier.

According to a third aspect of the invention, a circuit for the power-on of a resistive load in the vicinity of zero voltage is provided, using the device for controlling a composite bridge.

To achieve these objects, the present invention provides a device for controlling a composite bridge, receiving an a.c. voltage and providing a rectified supply, and including two anode-gate thyristors, the cathodes of which are connected together to a positive output terminal, and the gates of which are interconnected. The device includes a single-throw switch, controllable to be turned off and on, connected on the one hand to the two gates and on the other hand to a reference potential; control means to turn on the switch, only in a predetermined voltage range around the voltage zero of an a.c. power supply of the composite bridge; and wherein said device is directly supplied by said a.c. voltage or said rectified voltage.

According to one embodiment of the present invention, the switch is mounted in series with a control resistor connected to the reference potential.

According to another embodiment of the present invention, the device includes a Zener diode for limiting a control voltage of the switch, connected between a control terminal of the switch and the reference potential.

According to another embodiment of the present invention, the switch is a gate turn-off thyristor.

According to another embodiment of the present invention, the device includes a diode between the gate of each thyristor in the bridge and the switch.

According to a second aspect of the invention, a circuit for limiting the surge in a storage capacitor of a power converter is provided, including a device for controlling a composite bridge in accordance with the first aspect of the present invention.

According to one embodiment of the second aspect of the present invention, the means for controlling the switch includes:

a bipolar transistor having a transmitter, a collector and a base, the collector of the transistor being connected to a control terminal of the switch and the transmitter of the transistor being connected to the reference potential; and a control Zener diode, setting the voltage range and connected between a second output terminal of the bridge issuing a rectified a.c. voltage and the base of the transistor.

The circuit for limiting the surge may include, in one embodiment, a Zener diode for starting up the control device connected, in series with a current limiting resistor, between a control terminal of the switch and an output terminal issuing a d.c. rectified power supply.

According to a third aspect of the invention, a circuit for powering-on a load in the vicinity of the transition through zero of a rectified a.c. voltage is provided, including a device for controlling a composite bridge according to the first aspect of the present invention.

According to one embodiment of the third aspect of the present invention, the means for controlling the switch includes:

an anode-gate thyristor controlled by a signal for powering-on the load and connected between a control terminal of the switch and the reference potential, the terminal for controlling the switch being connected, via current limiting resistors, to two terminals of an a.c. power supply; and a Zener diode connected between the gate of the thyristor and, via current limiting resistors, to the two terminals of the a.c. supply.

These objects, characteristics and advantages as well as others, of the present invention, will be discussed in detail in the following non-limiting description of a specific embodiment in relation with the accompanying drawings.

DETAILED DESCRIPTION

Figure 2:
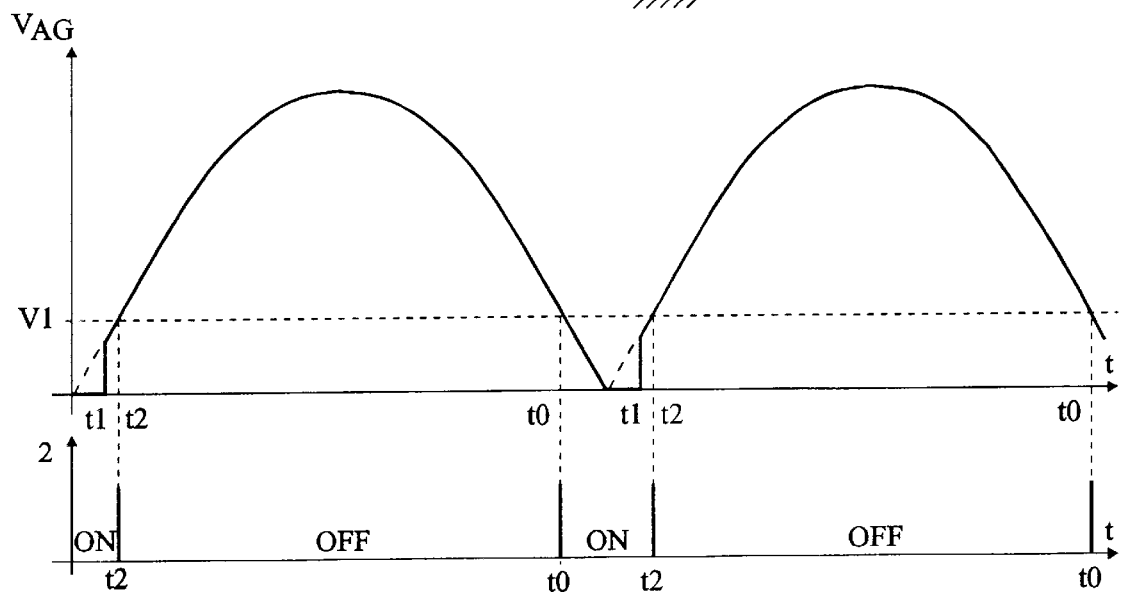
FIG. 2 illustrates, in the form of timing diagrams, the operation of a device such as shown in FIG. 1.
Figure 4:
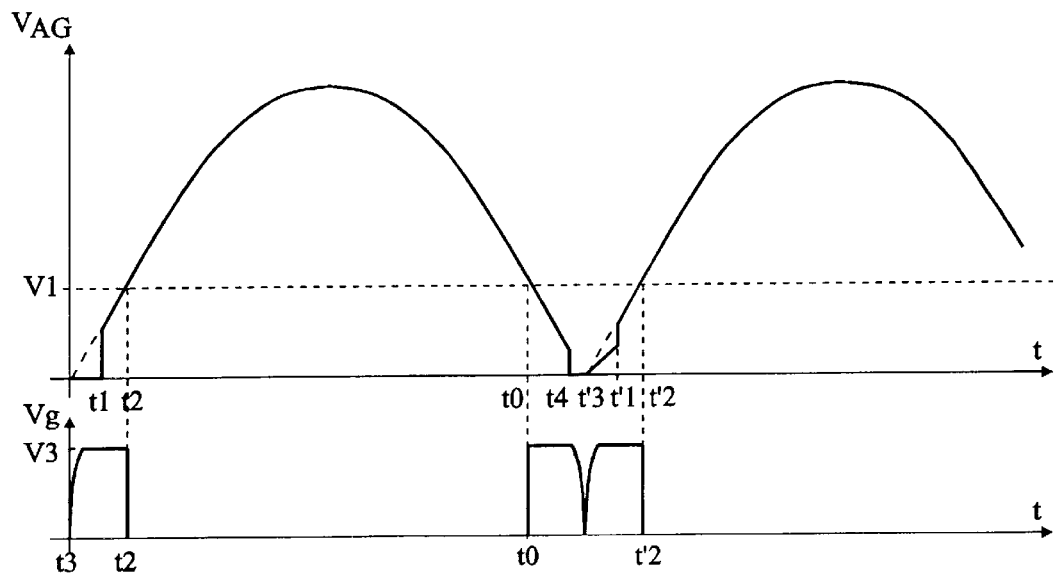
FIG. 4 illustrates, in the form of timing diagrams, the operation of a circuit such as shown in FIG. 3.
Figure 6:
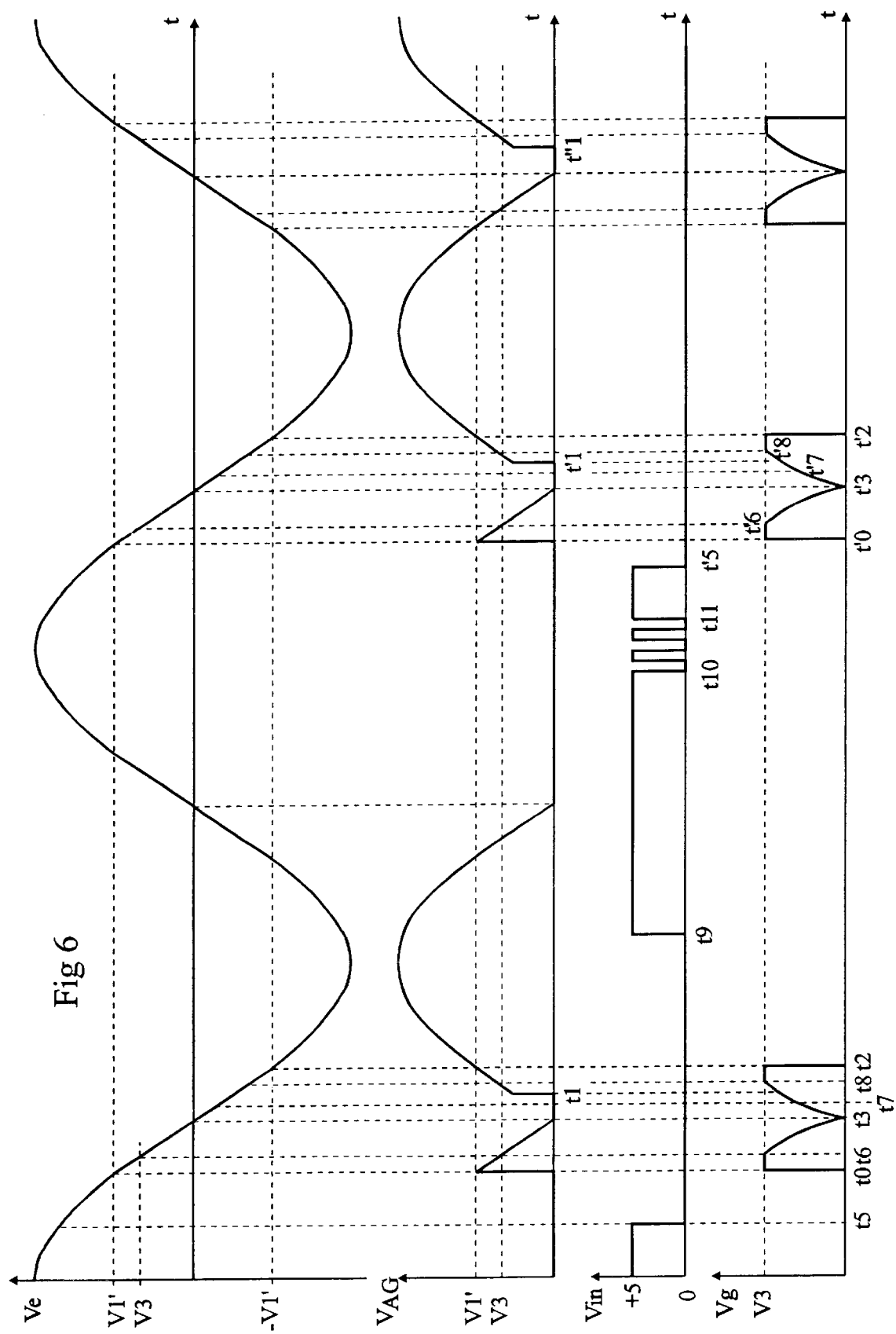
FIG. 6 illustrates, in the form of timing diagrams, the operation of a circuit such as shown in FIG. 5.

For clarity, the same components have been referred to by the same references in the different drawings. Similarly, the timing diagrams of FIGS. 2, 4 and 6 are not to scale. For clarity still, the voltage drops in forward-biased PN junctions of the described device and circuits will be neglected.

Figure 1:
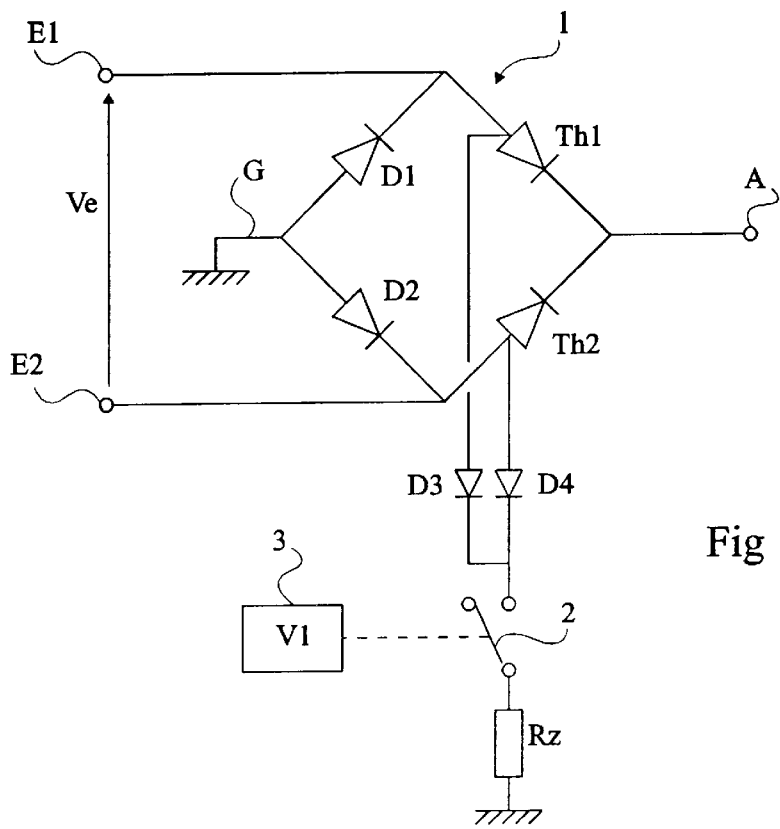
FIG. 1 shows an embodiment of a device for controlling a composite bridge according to the present invention.

FIGS. 1 and 2 illustrate a device for controlling switches of a composite bridge in the vicinity of zero voltage according to a first aspect of the present invention.

The present invention uses a composite bridge 1 (FIG. 1) comprised of two diodes D1 and D2 and of two anode-gate thyristors Th1 and Th2 or the equivalent. A first diagonal of bridge 1 is connected to terminals E1 and E2 of an a.c. power supply Ve, for example, the main voltage. A second diagonal of bridge 1 is connected to terminals A and G issuing a rectified power supply, with terminal G issuing a reference potential, generally the ground.

A characteristic of the present invention is to organize the control of composite bridge 1 by means of a switch 2 which can be controlled to be turned on and off to enable the bridge to enter conduction, only in the vicinity of a transition through a voltage zero of the a.c. voltage.

Switch 2 connects the anodes of thyristors Th1 and Th2 to the ground (terminal G) via a control resistor Rz. Two diodes, respectively D3 and D4, are interposed between the respective gates of thyristors Th1 and Th2 and switch 2 to avoid the short-circuiting of the a.c. power supply by the gates of thyristors Th1 and Th2.

Switch 2 is associated with control means 3 meant to turn it off when the absolute value of the a.c. supply voltage Ve exceeds a predetermined threshold value V1 and to turn it on when the value of voltage Ve is in a range included between −V1 and +V1. Thus, bridge 1 can only enter conduction within a voltage range (−V1, +V1) selected to be in the vicinity of the voltage zero. Once triggered, however, the thyristors of the bridge remain conductive until the end of the halfwave to supply the desired rectified power supply.

According to a feature of the invention, the control means 3 is supplied directly by the a.c. supply or by the rectified voltage from the composite bridge. This feature will be apparent from the description of FIGS. 3 and 5.

Figure 7:
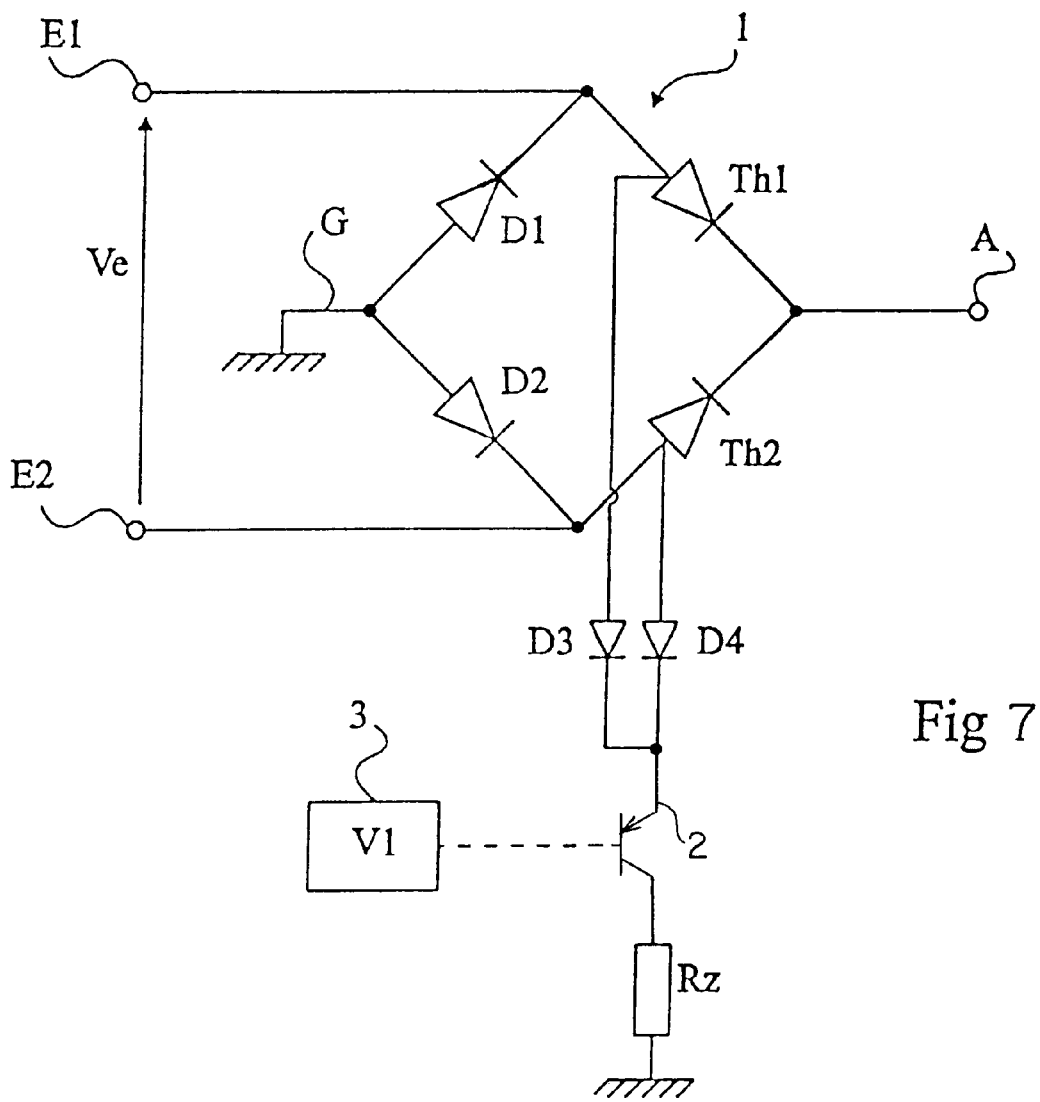
FIG. 7 shows an alternative embodiment of the circuit shown in FIG. 1.

According to a preferred embodiment of the present invention, switch 2 is a gate turn-off thyristor (GTO). It should however be noted that it can be replaced with a MOS or bipolar power transistor (FIG. 7). It should also be noted that switch 2 is either a single-throw switch by nature (which is the case for the GTO thyristor) or made a single-throw switch by means of diodes D3 and D4 interposed between switch 2 and the gates of thyristors Th1 and Th2.

FIG. 2 illustrates the operation of a control circuit such as shown in FIG. 1. FIG. 2 shows, in the form of timing diagrams, the course of the output voltage $V_{AG}$ of bridge 1 and the off and on time periods of switch 2.

At each end of a halfwave of voltage Ve (not shown in FIG. 2), switch 2 is turned on as soon as the absolute value of voltage Ve (or the value of voltage $V_{AG}$, neglecting the voltage drops in the PN junctions of the conducting diode and thyristor of the bridge) becomes lower than threshold voltage V1 (time t0). It remains on as long as voltage Ve has not reached voltage V1 at the beginning of the following halfwave, to enable forward-biased thyristor Th1 or Th2 to enter conduction at the following halfwave.

According to the present invention, resistance Rz and threshold voltage V1 (for example around 10 to 20 volts) are selected so that the current which flows through switch 2, when on, reaches the starting current of one of the thyristors of bridge 1 (taking the series resistance of switch 2 into account). As soon as this current is sufficient (time t1), the forward-biased thyristor starts and the bridge enters conduction until the end of the halfwave.

The turning-off of switch 2 occurs at time t2, when voltage $V_{AG}$ reaches threshold V1 at the vicinity of the beginning of the halfwave. Once switch 2 is turned off, this makes impossible for any new starting of the bridge within the same halfwave. This includes for example the case of a microfailure of voltage Ve. This design considerably decreases the power loss in resistor Rz.

Thus, an advantage of the present invention is that power loss in resistor Rz only happens under low voltage and for a short period, for each halfwave.

The use of the present invention will now be described with regard to two example circuits that will illustrate two other aspects of the invention.

Figure 3:
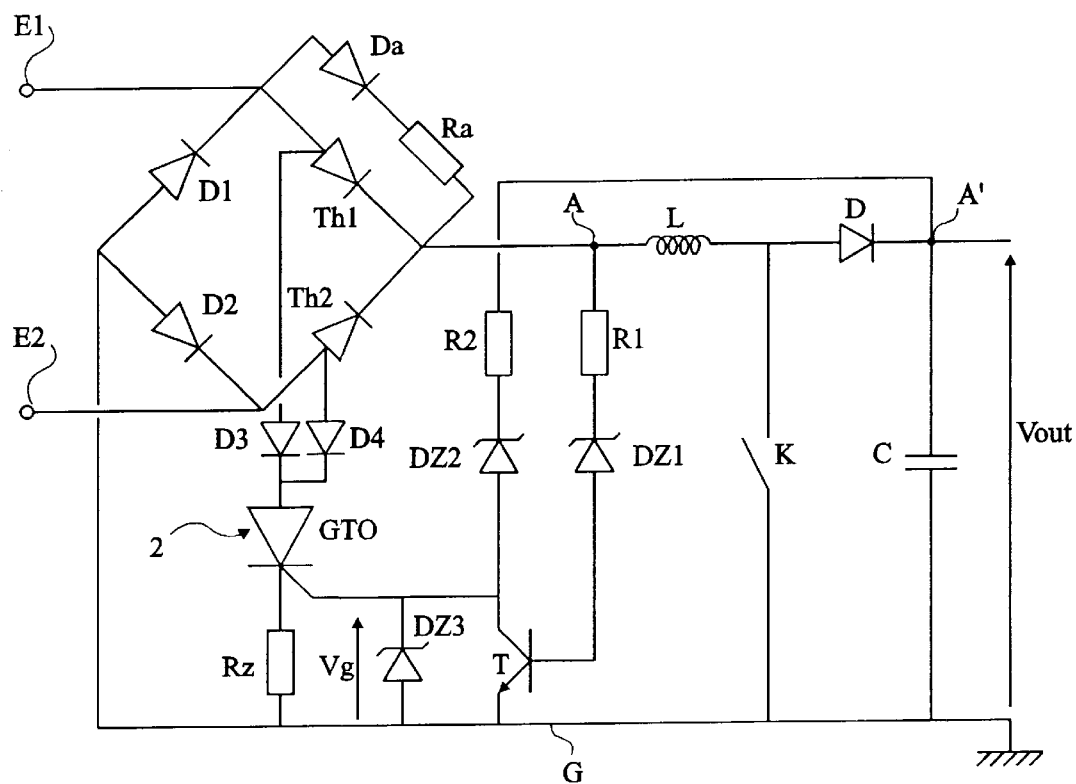
FIG. 3 shows an embodiment of a circuit for limiting the surge in a storage capacitor of a power converter according to a second aspect of the present invention.

FIGS. 3 and 4 describe the use of the circuit of FIG. 1 in an application to a circuit for limiting the surge in a storage capacitor of a power converter meant, for example, for a switch-mode power supply system.

An inductance L, in series with a diode D, is interposed between terminal A of bridge 1 and a first terminal A' of a storage capacitor C, the other terminal of which is connected to the ground (terminal G). A switch K is connected between the anode of diode D and the ground to generate a d.c. voltage by drawing from the main power supply a current which is in phase with the a.c. voltage. The voltage Vout between terminals A' and G constitutes a regulated d.c. supply voltage, for example of 400 volts. In the example shown, the converter acts as a so-called power factor compensating circuit. It should however be noted that the compensating circuit can be implemented by other conventional means, or even be omitted according to the application.

The limitation of the surge in capacitor C is performed by means of a resistor Ra, in series with a diode Da, mounted in parallel to one of the thyristors, for example Th1, of the bridge. In this embodiment, a single thyristor may be associated with a resistor Ra or a diode Da or the two thyristors may be associated with a resistor Ra and a diode Da.

According to the present invention, a control device such as that shown in FIG. 1 is used to control the composite bridge. The control means of switch 2, here a GTO thyristor, includes a bipolar transistor T, the collector of which is connected to the gate of the GTO thyristor and the transmitter of which is connected to the ground. The base of transistor T is connected, via a control Zener diode DZ1, in series with a resistor R1 for limiting the base current, to output terminal A of bridge 1. The threshold voltage V1 of diode DZ1 sets the on-range of the GTO thyristor.

The gate of the GTO thyristor is also connected, via a Zener diode DZ2, in series with a current limiting resistor R2, to terminal A' of capacitor C. The function of diode DZ2 is to make impossible the operation of the control device as long as the circuit for correcting the power factor is not in steady-state, that is, to force the current flow through diode Da and resistor Ra to enable the initial charge of capacitor C. The threshold voltage V2 of diode DZ2 is high (around a few hundred volts). Diode DZ2 thus constitutes means for starting-up the control device.

Initially, when capacitor C is discharged, voltage Vout is zero and the GTO thyristor is blocked (it receives no gate current). Thyristors Th1 and Th2 are thus also blocked. The initial charge of capacitor C thus happens by the flowing of a current through diode Da and resistor Ra.

As soon as the charge of capacitor C reaches value V2, diode DZ2 starts an avalanche, which makes the GTO thyristor enter conduction.

Preferably, a protecting Zener diode DZ3 is positioned between the gate of the GTO thyristor and the ground. Diode DZ3 both limits the gate voltage of the GTO thyristor and protect transistor T, which enables the use of a low-voltage transistor. It should be noted that resistor R2 enables the avoidance of any conflict which would otherwise arise between the charge level of capacitor C and the thresholds of Zener diodes DZ2 and DZ3 which would be, in the absence of resistor R2, connected in series between terminal A' and the ground.

The control device according to the present invention is then in service as long as the steady-state is maintained, that is, as long as diode DZ2 is in avalanche.

The operation of the circuit according to the present invention in the steady-state will be discussed in relation with FIG. 4 which shows, in the form of timing diagrams, voltage $V_{AG}$ and gate voltage Vg of the GTO thyristor.

At the beginning of a halfwave of the steady-state (time t3), thyristors Th1 and Th2 are blocked. Transistor T is also blocked since diode DZ1 does not conduct (voltage $V_{AG}$ is zero). The GTO thyristor can conduct since diode DZ2 is in avalanche. Voltage Vg is limited to the threshold voltage V3 of diode DZ3.

At a time t1, when the current through the GTO thyristor and resistor Rz is sufficient to trigger one of thyristors Th1 or Th2, the thyristor (Th2, in the example shown) which is forward-biased starts to conduct. Voltage $V_{AG}$ then joins the shape of the rectified halfwave.

At a time t2, when voltage $V_{AG}$ reaches threshold voltage V1 of diode DZ1, the latter diode starts an avalanche and transistor T is saturated. The GTO thyristor blocks, which suppresses any power loss in resistor Rz. Thyristor Th2 remains conductive for as long as it is forward-biased, that is, substantially until the end of the halfwave (time t3).

At a time t0, close to the end of the halfwave, when voltage $V_{AG}$ becomes lower than threshold V1, transistor T is blocked, which makes the GTO thyristor conductive again.

In practice, thyristor Th2 blocks a time t4, subsequent to time t0, when the current flowing therethrough becomes lower than its holding current.

The operation described hereabove is repeated for the following halfwave (times t'1 and t'2) with thyristor Th1. The only difference is that between times t'1 and t'2, voltage $V_{AG}$ is not zero. Indeed, a current flows through resistance Ra as long as thyristor Th1 is not conductive. This difference disappears if thyristor Th2 is also associated with a resistor Ra and a diode Da.

The power converter must operate in the vicinity of zero volts for an adequate operation of the circuit for correcting the power factor. This implies that thyristors Th1 and Th2 must start as soon as the supply voltage has reached a sufficient level (for example, around 10 to 20 volts). Thus, resistor Rz is selected to be low enough for the current which flows through the GTO thyristor to quickly reach the gate current Igt required to trigger one of thyristors Th1 or Th2. The fact that this current Igt must be able to flow through resistor Rz before the supply voltage reaches voltage V1 will also be taken into account.

According to an alternative embodiment, diode DZ1 is replaced with a resistive divider bridge, the medium top of which is connected with the base of transistor T.

It should be noted that resistive losses in resistor(s) Ra are minimized in the steady-state since they happen under low voltage (lower than V1).

It should also be noted that the control device is supplied directly by the rectified a.c. voltage without the addition of a transformer, a rectifying bridge and/or a storage capacitor.

Figure 5:
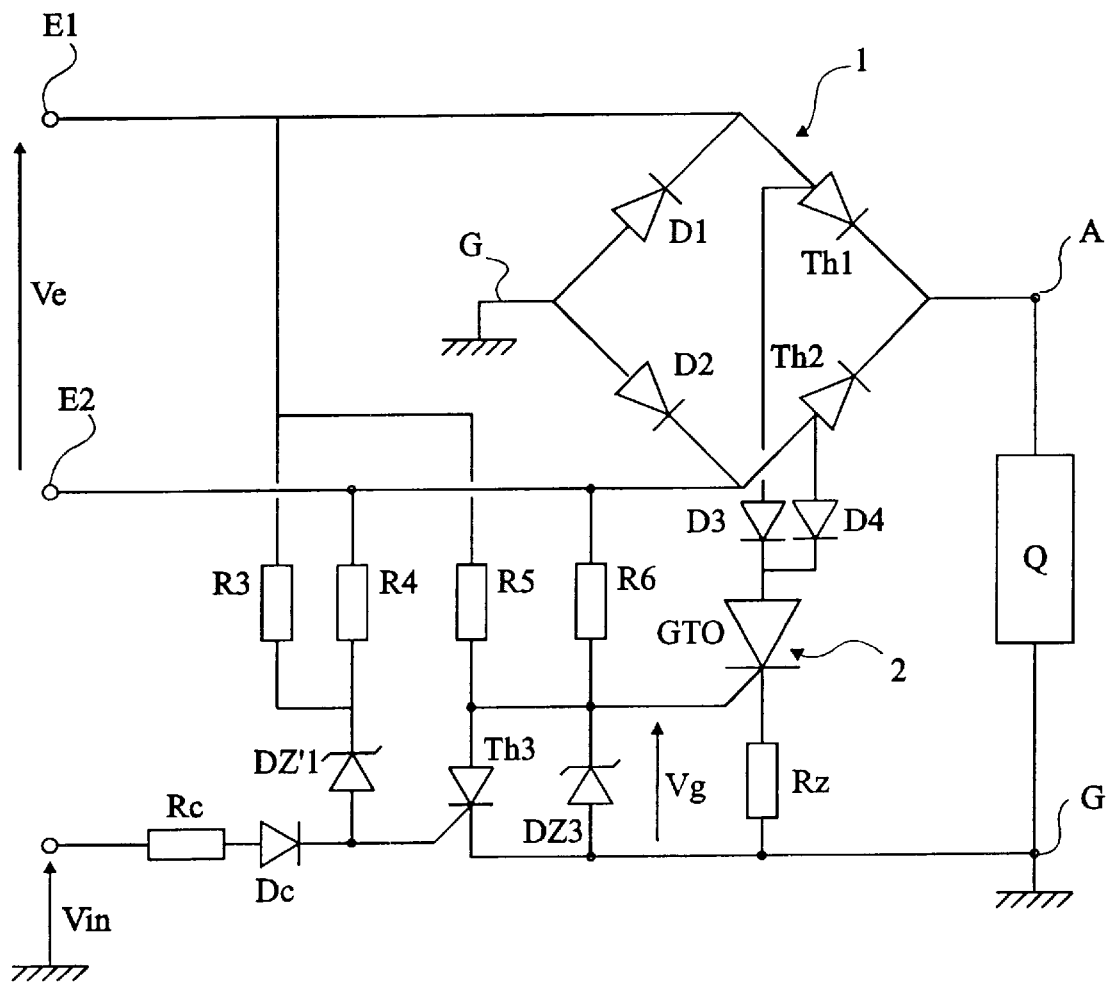
FIG. 5 shows an embodiment of a circuit for controlling a load in the vicinity of the voltage zero according to a third aspect of the present invention.

FIGS. 5 and 6 describe the use of the circuit of FIG. 1 in an application to a circuit for controlling a resistive load, for example an electric radiator.

Here, the control device as shown in FIG. 1 is used to enable signal Vin for powering-on a load Q, supplied by a rectified a.c. voltage $V_{AG}$, to ensure that the powering-on happens in the vicinity of a zero voltage.

A logic control signal Vin (for example, 0 and 5 volts) is applied, preferably via a resistance Rc and a diode Dc, to the gate of a thyristor Th3. The cathode of thyristor Th3 is connected to the ground (terminal G) and its anode is connected to the control terminal of switch 2, here the gate of a GTO thyristor.

The control of the GTO thyristor is performed based on the a.c. supply voltage Ve. Voltage threshold V1', setting the on range of the GTO thyristor, is set by a Zener control diode DZ1' connected to the gate of thyristor Th3 and, via resistors, respectively R3 and R4, to each of terminals E1 and E2 of a.c. voltage Ve.

The gate of the GTO thyristor is also connected, via resistors, respectively R5 and R6, to each of terminals E1 and E2 of the a.c. voltage.

Preferably, a Zener diode DZ3 is connected between the gate of the GTO thyristor and the ground. The function of this diode DZ3 is to limit the gate voltage of the GTO thyristor. Threshold voltage V3 of diode DZ3 is lower than threshold V1'.

Resistors R3 and R4 which limit the gate current of thyristor Th3 have the same value and are sized according to the threshold voltage of diode DZ1', taking into account the current Igt required to trigger thyristor Th3. Similarly, resistors R5 and R6 have the same value and are sized according to the threshold voltage of diode DZ3 taking into account the current Igt required to trigger the GTO thyristor.

It will be understood that the control device is directly supplied by the a.c. supply. The signal Vin is produced separately, but the supply of the load Q is enabled by the device according to the invention without necessitating supply means isolated from the a.c. supply.

Thus, as for the circuit disclosed in connection with FIG. 3, the implementation of the invention does not necessitate the addition of a transformer, a bridge and/or a capacitor for feeding the control circuit of the invention that is accordingly simple and cheap.

The operation of the circuit shown in FIG. 5 will be described hereafter in relation with FIG. 6 which shows, in the form of timing diagrams the course of output voltage $V_{AG}$ of bridge 1 and of the gate voltage Vg of the GTO thyristor, according to an a.c. supply signal Ve and a power-on signal Vin.

It is assumed that a low state (for example, 0 volts) of signal Vin indicates a power-on command for load Q, while a high state (for example, 5 volts) indicates that load Q must not be supplied.

It is assumed that a power-on command occurs during a positive halfwave at a time t5 when voltage Ve is higher than threshold voltage V1' of diode DZ1'. Since diode DZ1' is in avalanche, thyristor Th3 is on. This forbids any conduction of bridge 1 since the gate of the GTO thyristor is then forced to the ground.

When, around the end of the halfwave, voltage Ve becomes lower than voltage V1' (time t0), thyristor Th3 will block as soon as the current flowing therethrough becomes lower than its holding current since signal Vin still is in the low state. For clarity, the blocking of thyristor Th3 is nevertheless indicated at time t0 in FIG. 6. The GTO thyristor starts at once and its gate voltage is limited to voltage V3. One of the thyristors (for example, Th1) of bridge 1 enters conduction at time t0 and remains conductive substantially until the end of the half-wave (time t3).

At a time t6 (included between times t0 and t3) where voltage Ve becomes lower than V3, voltage Vg begins to decrease to zero and the GTO thyristor blocks.

At the beginning of the following halfwave, thyristor Th3 is still blocked (signal Vin is in the low state). Voltage Vg increases, following the course of the a.c. voltage.

At a time t7, when sufficient current flows through one of resistors R5 or R6, the GTO thyristor starts.

At a time t1, when the current flowing through the GTO thyristor and resistor Rz reaches the starting current Igt of one of the thyristors in the bridge (for example Th2), this thyristor triggers and the bridge enters conduction.

At a time t8, voltage Vg is limited to voltage V3 until a time t2 when voltage Ve becomes (in absolute values) higher than threshold V1' and when the GTO thyristor blocks due to the triggering of thyristor Th3.

It should be noted that between times t8 and t2, the current which flows through the GTO thyristor is constant. Resistors R3 to R6 and Rz, and voltages V1' and V3 thus have to be selected so that time t8 is subsequent to the triggering time t1 of one of thyristors Th1 or Th2 of bridge 1.

At a time t9, signal Vin switches from the high state indicating a command for stopping supply of the load. This command is taken into account at the following halfwave since the bridge thyristor which is conducting only blocks when the voltage across its terminals becomes zero.

Conversely, if after times t'5, t'0, t'6, t'3, t'7, t'1, t'8 and t'2 repeating the operation of times t5, t0, t6, t3, t7, t1, t8 and t2, signal Vin still is in the low state at the end of the halfwave, the thyristor associated with the halfwaves of opposite sign enters conduction at a time t"1 and the operation of times t0 to t2 is repeated for each halfwave.

Thus, the powering-on of load Q only happens in a predetermined voltage range (−V1', +V1') around zero voltage of the a.c. power supply.

It should be noted that the operation of load Q is not altered by microfailures of signal Vin (times t10 to t11) since both the powering-on and the turning-off of bridge 1 only happen in the vicinity of the transition through zero of the a.c. supply. For the same reasons, the circuit is insensitive to possible bounces of signal Vin (oscillations of signal Vin at a state-switching).

Of course, the present invention is likely to have various alterations, modifications, and improvements which will readily occur to those skilled in the art. In particular, the selection of the values of the resistances and the threshold voltages of the Zener diodes depends on the operating range desired for the switch and on the currents required to trigger the thyristors of the composite bridge. Moreover, the control device of a composite bridge according to the present invention applies to other power converting circuits than those described in relation with FIGS. 3 and 5. Further, instead of anode-gate thyristors, equivalent components can be used, for example triacs having their gates in series with diodes D3 and D4.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for controlling a composite bridge, the composite bridge receiving an a.c. voltage at a first terminal and providing a rectified voltage at a second terminal;

said device for controlling a composite bridge including:
a single-throw switch, controllable to be turned off and on, having a first terminal and a second terminal, the second terminal being connected to a reference potential; and
control means to turn on the switch, only in a predetermined voltage range around the voltage zero of an a.c. power supply of the composite bridge;

said composite bridge comprising:
two anode-gate thyristors, each having an anode, a cathode and a gate, the gates of said anode-gate thyristors connected together and connected to said first terminal of said single-throw switch, the cathodes of said anode-gate thyristors connected together and connected to said second terminal of said composite bridge,
and wherein said device is directly coupled to said a.c. voltage or said rectified voltage.

2. A device according to claim 1, wherein the switch is mounted in series with a control resistor connected to the reference potential.

3. A device according to claim 2, including a Zener diode for limiting a control voltage of the switch, connected between a control terminal of the switch and the reference potential.

4. A device according to claim 1 wherein the switch is a gate turn-off thyristor.

5. A device according to claim 1 further comprising a pair of diodes, with each diode of the pair being connected between the gate of an associated one of the thyristors in the bridge and the switch.

6. A power converter for providing a filtered rectified a.c. voltage at a first output terminal, comprising:
a bridge rectifier comprising
two anode-gate thyristors, each having a cathode, an anode and a gate, the cathodes of said anode-gate thyristors being connected to a second output terminal and the gates of said thyristors being interconnected;
a storage capacitor connected between said first output terminal and a reference potential;
a switch having a control terminal and being coupled between said bridge rectifier and the reference potential, said switch controlling the conduction of said bridge rectifier to produce a rectified a.c. voltage at said second output terminal; and means for controlling said switch for enabling said switch to allow for conduction through the bridge rectifier and comprising
- a bipolar transistor having an emitter, a collector and a base, said collector of said transistor being connected to said control terminal of said switch and said emitter of said transistor being connected to the reference potential; and
- a control Zener diode for setting a voltage range, said control Zener diode connected between said second output terminal and said base of said transistor.

7. The power converter according to claim 6, wherein said means for controlling enable said switch only in a predetermined voltage range around a zero voltage of said a.c. power supply, where said a.c. power supply is coupled directly to the anodes of said thyristors of said bridge rectifier.

8. A power converter according to claim 7, wherein the switch is mounted in series with a control resistor connected to the reference potential.

9. A power converter according to claim 7, including a Zener diode for limiting a control voltage of the switch, connected between a control terminal of the switch and the reference potential.

10. A power converter according to claim 7 wherein the switch is a gate turn-off thyristor.

11. A power converter according to claim 7 further comprising a pair of diodes, with each diode of the pair being connected between the gate of an associated one of the thyristors in the bridge rectifier and the switch.

12. A power converter according to claim 11, including a Zener diode for bringing the power converter into service, said Zener diode connected in series with a current limiting resistor between a control terminal of the switch and said first output terminal.

13. A power converter, comprising:
- means for providing a filtered rectified a.c. voltage at a first output terminal of said converter, said means including a storage capacitor; and
- a composite bridge, coupled directly to an a.c. power supply and coupled to said storage capacitor, for limiting a voltage surge at said storage capacitor;
  wherein said composite bridge comprises
  - two anode-gate thyristors, each having a cathode, an anode and a gate, the cathodes of the thyristors being connected to a second output terminal providing a rectified a.c. voltage and the gates of the thyristors being interconnected;
  - a single-throw switch, controllable to be turned off and on, connected between the interconnected gates of the thyristors and a reference potential; and
  - control means, coupled to said switch for turning on said switch only in a predetermined voltage range around a zero voltage of said a.c. power supply, where said a.c. power supply is coupled directly to the anodes of said thyristors of said composite bridge;
  wherein the control means comprises
  - a bipolar transistor having an emitter, a collector and a base, the collector of the transistor being connected to a control terminal of the switch and the emitter of the transistor being connected to the reference potential; and
  - a control Zener diode for setting a voltage range, said control Zener diode connected between second output terminal of said bridge and said base of said transistor.

14. A power converter according to claim 13, including a Zener diode for bringing the power converter into service, said Zener diode connected in series with a current limiting resistor between said control terminal of the switch and said first output terminal.

15. A circuit connected to an a.c. power supply having two terminals for powering-on a load, said circuit comprising:
- a switch, having a control terminal, connected between a bridge rectifier and a reference potential for enabling conduction through said bridge rectifier;
- control means, coupled to said switch for turning on said switch and thereby enabling conduction through said bridge rectifier, said control means turning said switch on only in a predetermined voltage range around a zero voltage of said a.c. voltage supply and thereby control the power at the load during the transition of a voltage provided by said a.c. power source through zero wherein said control means comprises
  - a cathode-gate thyristor having a gate terminal controlled by a signal for powering on the load and connected between said control terminal of said switch and said reference potential, said control terminal being connected, through a first set of current limiting resistors to said two terminals of said a.c. voltage supply; and
  - a Zener Diode connected between said gate terminal of said cathode-gate thyristor and, through a second set of current limiting resistors, to said two terminals of said a.c. voltage supply.

16. The circuit according to claim 15, wherein said bridge rectifier comprises
- two anode-gate thyristors, each having a cathode, an anode and a gate, the cathodes of the thyristors being connected to an output terminal and the gates of the thyristors being interconnected and connected to said switch, said output terminal providing a rectified a.c. voltage.

17. A circuit according to claim 16, wherein the switch is mounted in series with a control resistor connected to the reference potential.

18. A circuit according to claim 16, including a Zener diode for limiting a control voltage of the switch, connected between said control terminal of the switch and the reference potential.

19. A circuit according to claim 16 wherein the switch is a gate turn-off thyristor.

20. A circuit according to claim 16 further comprising a pair of diodes, with each diode of the pair being connected between the gate of an associated one of the thyristors in the bridge and the switch.

21. A circuit for powering-on a load using a rectified a.c. voltage, said circuit comprising:
- a rectified a.c. power source;
- a load, coupled to said rectified a.c. power source; and
- a power control circuit, coupled between an a.c. power supply and said load, including a composite bridge, coupled directly to said a.c. power supply, for providing said rectified a.c. power source, said power control circuit for controlling the power at the load during the transition of a voltage provided by said a.c. power supply through zero;
  wherein said composite bridge comprises
  - two anode-gate thyristors, each having a cathode, an anode and a gate, the cathodes of the thyristors being connected to an output terminal and the gates of the thyristors being interconnected, said output terminal providing a rectified a.c. voltage;

wherein said power control circuit comprises
a single-throw switch, controllable to be turned off and on, connected between the interconnected gates of the thyristors and a reference potential; and
control means, coupled to said switch for turning on said switch only in a predetermined voltage range around a zero voltage of said a.c. power supply coupled to the anodes of said thyristors;
wherein the controls means comprises
a cathode-gate thyristor controlled by a signal for powering-on the load and connected between a control terminal of the switch and the reference potential, the terminal for controlling the switch being connected, via a first set of current limiting resistors, to two terminals of said a.c. power supply; and
a Zener diode connected between the gate of the cathode gate thyristor and, via second set of current limiting resistors, to the two terminals of said a.c. power supply.

22. An apparatus comprising:
an a.c. voltage supply;
a controlling device; and
a composite bridge coupled directly to said a.c. voltage supply, for providing a rectified a.c. voltage at a first output, the conduction through said composite bridge being controlled by said controlling device, wherein said composite bridge includes two anode-gate thyristors, each having an anode, cathode and a gate, said gates of said anode-gate thyristors connected together and connected to said controlling device, said cathodes of said anode-gate thyristors connected together and connected to said first output of said composite bridge;
wherein said controlling device controls said composite bridge and is directly coupled to said a.c. voltage supply or said first output of said composite bridge and includes
means for providing a threshold voltage; and
means for initiating operation of said composite bridge when said rectified a.c. voltage at said first output is below said threshold voltage.

23. The apparatus according to claim 22, wherein said composite bridge further comprises:
a pair of diodes, each having a cathode and an anode, the anodes of the diodes being interconnected and coupled to ground, the cathodes of each of said diodes being connected to a different one of said anodes of said anode-gate thyristors.

24. An apparatus according to claim 22, wherein said means for initiating operation of said composite bridge further comprises:
a switch coupled to said composite bridge, said switch having a first position coupling said composite bridge to a ground voltage, and a second position coupling said composite bridge to said means for providing a threshold voltage; and
means, coupled to said switch and to said threshold voltage, for controlling said switch such that said switch is in said second position when said rectified a.c. voltage is less than said threshold voltage.

25. The apparatus according to claim 24, wherein said switch further comprises a transistor.

26. The apparatus according to claim 24, wherein said switch further comprises a gate turn-off thyristor.

27. A system for providing power to a resistive load, the resistive load being coupled between a rectified a.c. voltage and ground, said system being connected to an a.c. voltage supply and comprising:
a composite bridge, connected directly to said a.c. voltage supply, for providing said rectified a.c. voltage, the composite bridge comprising a pair of anode-gate thyristors, each having a cathode, and anode and a gate, said cathodes of said thryristors being interconnected and coupled to a common output terminal, said output terminal for supplying said rectified a.c. voltage; and
means for enabling or disabling operation of said composite bridge connected to the gates of said anode-gate thyristors and responsive to a relative relationship between said rectified a.c. voltage and a threshold voltage, wherein said means for enabling and disabling includes
a switch coupled to said composite bridge, said switch having a first position blocking said composite bridge, and a second position enabling said composite bridge; and
means, coupled to said switch and to said threshold voltage, for controlling said switch such that said switch is in said second position when said rectified a.c. voltage is less than said threshold voltage; wherein said means for controlling said switch includes means for providing said threshold voltage; and
a thyristor having an anode, cathode and gate, said anode of said thyristor coupled to a control input of said switch, said cathode of said thyristor coupled to said ground, and said gate of said thyristor coupled to said means for providing a threshold voltage, said thyristor having a blocked and an unblocked state, said thyristor enabling said switch when in a blocked state, and disabling said switch when in an unblocked state;
wherein said means for providing said threshold voltage includes
a voltage source; and
a Zener diode having an anode and a cathode, said anode of said Zener diode coupled to said means for providing said threshold voltage and to said gate of said thyristor, said cathode of said Zener diode coupled to said a.c. voltage supply; and
wherein said threshold voltage is a voltage required to cause said Zener diode to enter an avalanche mode.

28. The system of claim 27, wherein said composite bridge further comprises:
a pair of diodes, each having a cathode and an anode, the anodes of the diodes being interconnected and coupled to ground, the cathodes of each of said diodes being connected to a different one of said anodes of said thyristors.

29. The system of claim 27, wherein said switch further comprises a gate turn-off thyristor.

30. A system as recited in claim 29, further comprising:
a zener diode, coupled between a control input of said switch and ground, for protecting said switch against overvoltage.

31. A system for protecting against power surges comprising:
an a.c. voltage supply;
a composite bridge connected directly to said a.c. voltage supply, for providing a rectified a.c. voltage at a rectified a.c. voltage terminal and having a pair of anode-gate thyristors, each having a cathode, an anode and a gate, said cathodes of said thryristors being interconnected and coupled to a rectified a.c. voltage terminal;

means, coupled to said composite bridge, for providing a filtered a.c. voltage at an output; and means for enabling and disabling operation of said composite bridge responsive to said rectified a.c. voltage exceeding a threshold voltage;

wherein said means for enabling and disabling comprises:
a switch coupled to said gates of said anode-gate thyristors, said switch having a first position blocking said composite bridge, and a second position enabling said composite bridge; and means, coupled to said switch and to said threshold voltage, for controlling said switch such that said switch is in said second position when said rectified a.c. voltage is less than said threshold voltage, wherein said means for controlling said switch includes
a transistor having an emitter, collector, and base, said collector coupled to a control input of said switch, said emitter coupled to ground; and
a Zener diode having an anode and a cathode, said anode coupled to said base of said transistor, said cathode coupled in series with a resistor to said rectified a.c. voltage terminal;

wherein said threshold voltage is a voltage required to cause said Zener diode to enter an avalanche mode.

32. The system of claim 31, wherein said means for providing said filtered voltage at said output further comprises:
an inductor, coupled to said rectified a.c. voltage terminal;
a diode having an anode and a cathode, said anode of said diode coupled to said inductor;
a switch, coupled between said anode of said diode and ground; and
a capacitor, coupled between said cathode of said diode and ground, wherein a voltage across said capacitor provides said filtered a.c. output voltage.

33. The system of claim 31, wherein said composite bridge further comprises:
a pair of diodes, each having a cathode and an anode, the anodes of the diodes being interconnected and coupled to ground, the cathodes of each of said diodes being connected to a different one of said anodes of said thyristors.

34. The system according to claim 31, wherein said switch further comprises a gate turn-off thyristor.

35. A system as recited in claim 34, further comprising:
a zener diode, coupled between a control input of said switch and ground, for protecting said switch against overvoltage.

36. A system for protecting against power surges at a d.c. output comprising:
an a.c. voltage supply;
a composite bridge, connected directly to said a.c. voltage supply to provide a rectified a.c. voltage, said composite bridge further comprising:
a pair of anode-gate thyristors, each having a cathode, and anode and a gate, said cathodes of said thyristors being interconnected and coupled to a common output terminal, said output terminal for supplying said rectified a.c. voltage; and
a pair of diodes, each having a cathode and an anode, the anodes of the diodes being interconnected and coupled to ground, the cathodes of each of said diodes being connected to a different one of said anodes of said thyristors;

a power factor compensating circuit comprising:
an inductor, coupled to said rectified a.c. output;
a diode having an anode and a cathode, said anode of said diode coupled to said inductor;
a switch, coupled between said anode of said diode and ground;
a capacitor, coupled between said cathode of said diode and ground, wherein a voltage across said capacitor provides said converted d.c. output voltage;

a switch thyristor, coupled to said rectified a.c. voltage, said thyristor having a gate, an anode and a cathode, said anode of said thyristor coupled to said gates of said thyristors of said composite bridge, said cathode of said thyristor coupled via a resistor to ground;

a transistor having a emitter, collector, and base, said collector coupled to a said gate of said switch thyristor, said emitter coupled to ground; and a Zener diode having an anode and a cathode, said anode coupled to said base of said transistor, said cathode coupled in series with a resistor to said rectified a.c. voltage.

37. A system for providing power to a resistive load comprising:
an a.c. voltage supply;
a composite bridge connected directly to said a.c. voltage supply for providing a rectified a.c. voltage to said load, said composite bridge further comprising:
a pair of anode-gate thyristors, each having a cathode, and anode and a gate, said cathodes of said thyristors being interconnected and coupled to a common output terminal, said output terminal for supplying said rectified a.c. voltage; and
a pair of diodes, each having a cathode and an anode, the anodes of the diodes being interconnected and coupled to ground, the cathodes of each of said diodes being connected to a different one of said anodes of said thyristors;

a switch thyristor, coupled to said gates of said thyristors of said composite bridge and having a first position initiating conduction by said composite bridge, and a second position inhibiting conduction by said composite bridge, said switch thyristor initiating conduction when said rectified a.c. voltage is less than a threshold voltage;

a voltage source;

a Zener diode having an anode and a cathode, said anode of said Zener diode coupled to said voltage source, said cathode of said Zener diode coupled to said a.c. voltage supply, and wherein said threshold voltage is a voltage that causes said Zener diode to enter an avalanche mode; and a control thyristor having an anode, cathode and gate, said anode of said control thyristor coupled to said gate of said switch thyristor, said cathode of said thyristor coupled to said ground, and said gate of said control thyristor coupled to said Zener diode, said control thyristor having a blocked and an unblocked state, said control thyristor enabling said switch thyristor when in a blocked state, and disabling said switch when in an unblocked state.

* * * * *